United States Patent
Kato et al.

(10) Patent No.: US 6,967,859 B2
(45) Date of Patent: Nov. 22, 2005

(54) FERROELECTRIC MEMORY CONFIGURATION HAVING SUCCESSIVELY CONNECTED FERROELECTRIC CAPACITOR COUPLING TO THE GATE OF A READ TRANSISTOR AND DIFFERENT BIAS VOLTAGES APPLIED IN READ/WRITE/ERASE

(75) Inventors: Yoshihisa Kato, Shiga (JP); Yasuhiro Shimada, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 4 days.

(21) Appl. No.: 10/626,722

(22) Filed: Jul. 25, 2003

(65) Prior Publication Data

US 2004/0145940 A1   Jul. 29, 2004

Related U.S. Application Data

(62) Division of application No. 09/905,893, filed on Jul. 17, 2001, now Pat. No. 6,614,678.

(30) Foreign Application Priority Data

Jul. 25, 2000 (JP) ........................ 2000-223405

(51) Int. Cl.⁷ ............................................. G11C 11/22
(52) U.S. Cl. ................................................. 365/145
(58) Field of Search ................................. 365/145

(56) References Cited

U.S. PATENT DOCUMENTS

6,151,242 A * 11/2000 Takashima ............... 365/145
6,198,652 B1  3/2001  Kawakubo et al.
6,366,488 B1  4/2002  Zambrano et al.

FOREIGN PATENT DOCUMENTS

| JP | 11-177036 | 7/1999 |
| JP | 2000-22010 A | 1/2000 |
| JP | 2000-156472 A | 6/2000 |

OTHER PUBLICATIONS

Jan. 7, 2005 First Office Action for Application No. CN-01120041.3 from State Intellectual Property Office of People's Republic of China.

* cited by examiner

Primary Examiner—VanThu Nguyen
(74) Attorney, Agent, or Firm—Nixon Peabody LLP; Donald R. Studebaker

(57) ABSTRACT

A semiconductor memory of this invention contains a memory cell block including a plurality of ferroelectric capacitors successively connected to one another along a bit line direction each for storing a data in accordance with displacement of polarization of a ferroelectric film thereof, and a reading transistor whose gate is connected to one end of the successively connected plural ferroelectric capacitors for reading a data by detecting the displacement of the polarization of the ferroelectric film of a ferroelectric capacitor selected from the plural ferroelectric capacitors. A set line is connected to the other end of the successively connected plural ferroelectric capacitors. A bit line is connected to the drain of the reading transistor at one end thereof. A reset line is connected to the source of the reading transistor at one end thereof. A plurality of word lines respectively corresponding to the plural ferroelectric capacitors are provided perpendicularly to the bit line, so as to select a ferroelectric capacitor from the plural ferroelectric capacitors for data write or data read.

8 Claims, 6 Drawing Sheets

FERROELECTRIC MEMORY CONFIGURATION HAVING SUCCESSIVELY CONNECTED FERROELECTRIC CAPACITOR COUPLING TO THE GATE OF A READ TRANSISTOR AND DIFFERENT BIAS VOLTAGES APPLIED IN READ/WRITE/ERASE

This Application is a Divisional of 09/905,893, filed Jul. 17, 2001, now U.S. Pat. No. 6,614,678.

BACKGROUND OF THE INVENTION

The present invention relates to a semiconductor memory including a ferroelectric capacitor and a method for driving the semiconductor memory.

A known semiconductor memory including a ferroelectric capacitor is composed of, as shown in FIG. 6, a field effect transistor (hereinafter referred to as the FET) 1 having a drain region 1a, a source region 1b and a gate electrode 1c, and a ferroelectric capacitor 2 having an upper electrode 2a, a lower electrode 2b and a ferroelectric film 2c. This semiconductor memory employs the non-destructive read-out system in which the lower electrode 2b of the ferroelectric capacitor 2 is connected to the gate electrode 1c of the FET 1, so as to use the ferroelectric capacitor 2 for controlling the gate potential of the FET 1. In FIG. 6, a reference numeral 3 denotes a substrate.

In writing a data in this semiconductor memory, a writing voltage is applied between the upper electrode 2a of the ferroelectric capacitor 2, which works as a control electrode, and the substrate 3.

For example, when a data is written by applying a voltage (control voltage) positive with respect to the substrate 3 to the upper electrode 2a, downward polarization is caused in the ferroelectric film 2c of the ferroelectric capacitor 2. Thereafter, even when the upper electrode 2a is grounded, positive charge remains in the gate electrode 1c of the FET 1, and hence, the gate electrode 1c has a positive potential.

When the potential of the gate electrode 1c exceeds the threshold voltage of the FET 1, the FET 1 is in an on-state. Therefore, when a potential difference is caused between the drain region 1a and the source region 1b, a current flows between the drain region 1a and the source region 1b. Such a logical state of the ferroelectric memory for allowing a current to flow between the drain region 1a and the source region 1b is defined, for example, as "1".

On the other hand, when a voltage negative with respect to the substrate 3 is applied to the upper electrode 2a of the ferroelectric capacitor 2, upward polarization is caused in the ferroelectric film 2c of the ferroelectric capacitor 2. Thereafter, even when the upper electrode 2a is grounded, negative charge remains in the gate electrode 1c of the FET 1, and hence, the gate electrode 1c has a negative potential. In this case, the potential of the gate electrode 1c is always lower than the threshold voltage of the FET 1, the FET 1 is in an off-state. Therefore, even when a potential difference is caused between the drain region 1a and the source region 1b, no current flows between the drain region 1a and the source region 1b. Such a logical state of the ferroelectric memory for allowing no current to flow between the drain region 1a and the source region 1b is defined, for example, as "0".

Even when the power supply to the ferroelectric capacitor 2 is shut off, namely, even when the voltage application to the upper electrode 2a of the ferroelectric capacitor 2 is stopped, the aforementioned logical states are retained, and thus, a nonvolatile memory is realized. Specifically, when power is supplied again to apply a voltage between the drain region 1a and the source region 1c after shutting off the power supply for a given period of time, a current flows between the drain region 1a and the source region 1b if the logical state is "1", so that the data "1" can be read, and no current flows between the drain region 1a and the source region 1b if the logical state is "0", so that the data "0" can be read.

In order to correctly retain a data while the power is being shut off (which characteristic for retaining a data is designated as retention), it is necessary to always keep the potential of the gate electrode 1c of the FET 1 to be higher than the threshold voltage of the FET 1 when the data is "1" and to always keep the potential of the gate electrode 1c of the FET 1 at a negative voltage when the data is "0".

While the power is being shut off, the upper electrode 2a of the ferroelectric capacitor 2 and the substrate 3 have a ground potential, and hence, the potential of the gate electrode 1c is isolated. Therefore, ideally, as shown in FIG. 7, a first intersection c between a hysteresis loop 4 obtained in writing a data in the ferroelectric capacitor 2 and a gate capacitance load line 5 of the FET 1 obtained when a bias voltage is 0 V corresponds to the potential of the gate electrode 1c obtained in storing a data "1", and a second intersection d between the hysteresis loop 4 and the gate capacitance load line 5 corresponds to the potential of the gate electrode 1c obtained in storing a data "0". In FIG. 7, the ordinate indicates charge Q appearing in the upper electrode 2a (or the gate electrode 1c) and the abscissa indicates voltage V.

Actually, however, the ferroelectric capacitor 2 is not an ideal insulator but has a resistance component, and hence, the potential of the gate electrode 1c drops through the resistance component. This potential drop is exponential and has a time constant obtained by multiplying parallel combined capacitance of the gate capacitance of the FET 1 and the capacitance of the ferroelectric capacitor 2 by the resistance component of the ferroelectric capacitor 2. The time constant is approximately $10^4$ seconds at most. Accordingly, the potential of the gate electrode 1c is halved within several hours.

Since the potential of the gate electrode 1c is approximately 1 V at the first intersection c as shown in FIG. 7, when the potential is halved, the potential of the gate electrode 1c becomes approximately 0.5 V, which is lower than the threshold voltage of the FET 1 (generally of approximately 0.7 V). As a result, the FET 1 that should be in an on-state is turned off in a short period of time.

In this manner, although the ferroelectric memory using the ferroelectric capacitor 2 for controlling the gate potential of the FET 1 has an advantage that a rewrite operation is not necessary after a data read operation, it has the following problem: The gate electrode 1c of the FET 1 obtains a potential after writing a data, and the ability for keeping the gate potential determines the retention characteristic. Since the time constant until discharge of the ferroelectric capacitor 2 is short due to the resistance component of the ferroelectric capacitor 2, the data retaining ability is short, namely, the retention characteristic is not good.

Furthermore, in accordance with increased integration and refinement of semiconductor integrated circuit devices, the area of a semiconductor memory built on a semiconductor integrated circuit device is desired to be reduced. In the conventional semiconductor memory, however, each memory cell includes the ferroelectric capacitor 2 and the FET 1 for reading a data stored in the ferroelectric capacitor 2, and hence, the area of each memory cell, namely, the area of the entire semiconductor memory, cannot be sufficiently reduced.

SUMMARY OF THE INVENTION

In consideration of the aforementioned conventional problems, a first object of the invention is improving the retention characteristic of a semiconductor memory including a ferroelectric capacitor for storing a data in accordance with displacement of polarization of a ferroelectric film thereof, and a second object is reducing the area of the semiconductor memory.

The semiconductor memory of this invention comprises a memory cell block including a plurality of ferroelectric capacitors successively connected to one another along a bit line direction each for storing a data in accordance with displacement of polarization of a ferroelectric film thereof, and a reading transistor whose gate is connected to one end of the plurality of successively connected ferroelectric capacitors for reading a data by detecting the displacement of the polarization of the ferroelectric film of a selected ferroelectric capacitor selected from the plurality of ferroelectric capacitors; a set line connected to the other end of the plurality of successively connected ferroelectric capacitors; a bit line connected to a drain of the reading transistor at one end thereof; a reset line connected to a source of the reading transistor at one end thereof; and a plurality of word lines respectively corresponding to the plurality of ferroelectric capacitors and provided perpendicularly to the bit line for selecting the selected ferroelectric capacitor from the plurality of ferroelectric capacitors for data write or data read.

In the semiconductor memory of this invention, the gate of the reading transistor for detecting the displacement of the polarization of the ferroelectric film of the selected ferroelectric capacitor is connected to one end of the plural ferroelectric capacitors successively connected along the bit line direction. Therefore, there is no need to provide a reading transistor in every memory cell, and hence, not only the area of each memory cell but also the area of the entire semiconductor memory can be reduced.

Furthermore, since the plural word lines provided perpendicularly to the bit line are used for selecting a ferroelectric capacitor for data write or data read, even though merely one reading transistor is connected to the plural ferroelectric capacitors, the data write or data read can be definitely carried out in a selected ferroelectric capacitor.

Moreover, since the amplifying function of the reading transistor can be utilized in reading a data, the sensitivity for detecting the displacement of the polarization of the ferroelectric film of the selected ferroelectric capacitor can be improved.

The semiconductor memory of this invention preferably further comprises a plurality of selecting transistors respectively connected to the plurality of ferroelectric capacitors in parallel whose gates are respectively connected to the plurality of word lines.

In this manner, a ferroelectric capacitor for data write or data read can be selected by turning on/off the selecting transistors by controlling the voltages applied to the respective word lines. Also, a potential difference induced between the upper electrode and the lower electrode of the selected ferroelectric capacitor can be removed by turning on the selecting transistor, and hence, the lowering of the potential difference through a resistance component of the ferroelectric capacitor can be avoided, resulting in improving the retention characteristic.

In the semiconductor memory, it is preferred that a first division voltage obtained by dividing a reading voltage applied to the set line on the basis of a ratio between capacitance of the selected ferroelectric capacitor and gate capacitance of the reading transistor is induced to the gate of the reading transistor, and that the reading voltage is set to such magnitude that a relationship of VR>VT>VS holds among a threshold voltage VT of the reading transistor, a first division voltage VS induced to the gate of the reading transistor when a data is written in the selected ferroelectric capacitor and a first division voltage VR induced to the gate of the reading transistor when a data is not written in the selected ferroelectric capacitor.

When the reading voltage is set such magnitude that the relationship of VR>VT>VS holds, a data stored in a ferroelectric capacitor can be read without fail even if the potential difference induced between the upper electrode and the lower electrode of the ferroelectric capacitor is removed.

In the semiconductor memory, it is preferred that a second division voltage obtained by dividing a reading voltage applied to the set line on the basis of a ratio between capacitance of the selected ferroelectric capacitor and gate capacitance of the reading transistor is induced between an upper electrode and a lower electrode of the selected ferroelectric capacitor, and that the reading voltage is set to such magnitude that the second division voltage does not exceed a coercive voltage of the selected ferroelectric capacitor.

When the reading voltage is set to such magnitude that the second division voltage applied between the upper electrode and the lower electrode of the selected ferroelectric capacitor does not exceed the coercive voltage of the ferroelectric capacitor, the displacement of the polarization of the ferroelectric film can be definitely restored to that obtained before reading a data by removing the reading voltage applied to the set line.

The semiconductor memory preferably further comprises a load resistance connected, at one end thereof, to the other end of the bit line.

In this manner, voltage change caused at both ends of the load resistance owing to a current flowing between the drain and the source of the reading transistor, namely, flowing to the bit line, can be detected in applying the reading voltage to the set line. Therefore, a data written in the selected ferroelectric capacitor can be detected. Also, the voltage change caused in the load resistance can be always detected as far as the reading voltage is applied differently from voltage change caused in a load capacitor, and hence, the voltage change can be thus easily detected.

In the case where the semiconductor memory includes the load resistance, the load resistance is preferably a MOS transistor.

Thus, the load resistance can be actively driven.

In the case where the semiconductor memory includes the load resistance, it is preferred that a power voltage is applied to the other end of the load resistance, and that the semiconductor memory further comprises comparison means for comparing, with a reference voltage, voltage change caused at both ends of the load resistance owing to a current flowing between the drain and the source of the reading transistor in accordance with the displacement of the polarization of the ferroelectric film of the selected ferroelectric capacitor.

In this manner, by comparing, with the reference voltage, the voltage change caused at both ends of the load resistance owing to a current flowing between the drain and the source of the reading transistor, namely, a current flowing to the bit line, in applying the reading voltage to the set line, a data written in the selected ferroelectric capacitor can be easily and definitely detected.

The semiconductor memory of this invention preferably further comprises a second memory cell block having the same configuration as the memory cell block and disposed on a side of the memory cell block along a word line direction; a second bit line connected, at one end thereof, to a drain of a second reading transistor included in the second memory cell block; a first load resistance connected to the other end of the bit line at one end thereof and connected to a power voltage at the other end thereof; and a second load resistance connected to the other end of the second bit line at one end thereof and connected to the power voltage at the other end thereof, and it is preferred that the set line is connected to the other end of a plurality of ferroelectric capacitors included in the second memory cell block, that the reset line is connected to a source of the second reading transistor included in the second memory cell block, and that the semiconductor memory further comprises comparison means for comparing, in applying a reading voltage to the set line, first voltage change caused at both ends of the first load resistance owing to a current flowing between the drain and the source of the reading transistor with second voltage change caused at both ends of the second load resistance owing to a current flowing between the drain and the source of the second reading transistor.

In this manner, the first voltage change caused at both ends of the former load resistance owing to a current flowing between the drain and the source of the reading transistor included in the memory cell block where a data is read is compared with the second voltage change caused at both ends of the latter load resistance owing to a current flowing between the drain and the source of the second reading transistor included in the second memory cell block where a data is not read, so as to definitely detect a data written in the selected ferroelectric capacitor included in the memory cell block where the data is read.

In the first method for driving a semiconductor memory of this invention, the semiconductor memory contains a memory cell block including a plurality of ferroelectric capacitors successively connected to one another along a bit line direction each for storing a data in accordance with displacement of polarization of a ferroelectric film thereof and a reading transistor whose gate is connected to one end of the plurality of successively connected ferroelectric capacitors for reading a data by detecting the displacement of the polarization of the ferroelectric film of a selected ferroelectric capacitor selected from the plurality of ferroelectric capacitors; a set line connected to the other end of the plurality of successively connected ferroelectric capacitors; a bit line connected to a drain of the reading transistor at one end thereof; a reset line connected to a source of the reading transistor at one end thereof; and a plurality of word lines respectively corresponding to the plurality of ferroelectric capacitors and provided perpendicularly to the bit line for selecting the selected ferroelectric capacitor, and voltages applied to the set line, the reset line and the word lines in selecting the selected ferroelectric capacitor or writing a data in the selected ferroelectric capacitor are a power voltage or a ground voltage.

In the first method for driving a semiconductor memory, the voltages applied to the set line, the reset line and the word lines in selecting a ferroelectric capacitor or in writing a data in the selected ferroelectric capacitor are the power voltage or the ground voltage. Therefore, there is no need to provide a negative voltage generator for reversing the displacement of the polarization of the ferroelectric film of the ferroelectric capacitor. Also, it is not necessary to make a potential applied to a first well region of the reading transistor in applying a reverse bias voltage between the upper electrode and the lower electrode differ from a potential applied to a second well region of the reading transistor different from the first well region. Therefore, there is no need to separate the well region of the reading transistor between the first and second well regions.

As a result, the area of the semiconductor memory can be reduced.

In the second method for driving a semiconductor memory of this invention, the semiconductor memory contains a memory cell block including a plurality of ferroelectric capacitors successively connected to one another along a bit line direction each for storing a data in accordance with displacement of polarization of a ferroelectric film thereof and a reading transistor whose gate is connected to one end of the plurality of successively connected ferroelectric capacitors for reading a data by detecting the displacement of the polarization of the ferroelectric film of a selected ferroelectric capacitor selected from the plurality of ferroelectric capacitors; a set line connected to the other end of the plurality of successively connected ferroelectric capacitors; a bit line connected to a drain of the reading transistor at one end thereof; a reset line connected to a source of the reading transistor at one end thereof; and a plurality of word lines respectively corresponding to the plurality of ferroelectric capacitors and provided perpendicularly to the bit line for selecting the selected ferroelectric capacitor, and when none of the plurality of ferroelectric capacitors included in the memory cell block is selected in reading a data, the reading transistor included in the memory cell block is placed in an off-state.

In the second method for driving a semiconductor memory, when none of the plural ferroelectric capacitors included in the memory cell block is selected in reading a data, the reading transistor included in this memory cell block is placed in an off-state. Therefore, no current flows between the bit line and the reset line. Accordingly, in reading a data from a ferroelectric capacitor included in another memory cell block, even when a voltage is applied between the upper electrode and the lower electrode of the ferroelectric capacitor included in this memory cell block, this voltage application does not prevent the data read from a ferroelectric capacitor of another memory cell block.

Accordingly, the operation margin in reading a data can be enlarged, resulting in realizing a stable operation.

In the third method for driving a semiconductor memory of this invention, the semiconductor memory contains a memory cell block including a plurality of ferroelectric capacitors successively connected to one another along a bit line direction each for storing a data in accordance with displacement of polarization of a ferroelectric film thereof and a reading transistor whose gate is connected to one end of the plurality of successively connected ferroelectric capacitors for reading a data by detecting the displacement of the polarization of the ferroelectric film of a selected ferroelectric capacitor selected from the plurality of ferroelectric capacitors; a set line connected to the other end of the plurality of successively connected ferroelectric capacitors; a bit line connected to a drain of the reading transistor at one end thereof; a reset line connected to a source of the reading transistor at one end thereof; and a plurality of word lines respectively corresponding to the plurality of ferroelectric capacitors and provided perpendicularly to the bit line for selecting the selected ferroelectric capacitor, and a step of writing a data in the selected ferroelectric capacitor includes sub-steps of causing a potential difference obtained by subtracting a ground voltage from a power voltage between an upper electrode and a lower electrode of the selected ferroelectric capacitor by applying the power voltage to the set line and applying the ground voltage to the reset line, whereby turning the polarization of the ferroelectric film of the selected ferroelectric capacitor to a direction of potential gradient of the potential difference; and after causing the potential difference, removing the potential difference caused between the upper electrode and the lower electrode of the selected ferroelectric capacitor by applying the ground voltage to the set line.

In the third method for driving a semiconductor memory, in writing a data in the selected ferroelectric capacitor, the data is written by causing a potential difference between the upper electrode and the lower electrode of the selected ferroelectric capacitor, and then, the potential difference caused between the upper electrode and the lower electrode of the selected ferroelectric capacitor is removed. Therefore, the lowering of the potential difference through a resistance component of the ferroelectric capacitor can be avoided, resulting in improving the retention characteristic.

In the fourth method for driving a semiconductor memory of this invention, the semiconductor memory contains a memory cell block including a plurality of ferroelectric capacitors successively connected to one another along a bit line direction each for storing a data in accordance with displacement of polarization of a ferroelectric film thereof and a reading transistor whose gate is connected to one end of the plurality of successively connected ferroelectric capacitors for reading a data by detecting the displacement of the polarization of the ferroelectric film of a selected ferroelectric capacitor selected from the plurality of ferroelectric capacitors; a set line connected to the other end of the plurality of successively connected ferroelectric capacitors; a bit line connected to a drain of the reading transistor at one end thereof; a reset line connected to a source of the reading transistor at one end thereof; and a plurality of word lines respectively corresponding to the plurality of ferroelectric capacitors and provided perpendicularly to the bit line for selecting the selected ferroelectric capacitor, and a step of erasing a data written in the selected ferroelectric capacitor includes sub-steps of causing a potential difference obtained by subtracting a power voltage from a ground voltage between an upper electrode and a lower electrode of the selected ferroelectric capacitor by applying the ground voltage to the set line and applying the power voltage to the reset line, whereby turning the polarization of the ferroelectric film of the selected ferroelectric capacitor to a direction of potential gradient of the potential difference; and after causing the potential difference, removing the potential difference caused between the upper electrode and the lower electrode of the selected ferroelectric capacitor by applying the ground voltage to the reset line.

In the fourth method for driving a semiconductor memory, in erasing a data written in the selected ferroelectric capacitor, the data is erased by causing a potential difference reverse to that caused in writing the data between the upper electrode and the lower electrode of the selected ferroelectric capacitor, and then, the potential difference caused between the upper electrode and the lower electrode of the selected ferroelectric capacitor is removed. Therefore, the lowering of the potential difference through a resistance component of the ferroelectric capacitor can be avoided, resulting in improving the retention characteristic.

In the fifth method for driving a semiconductor memory of this invention, the semiconductor memory contains a memory cell block including a plurality of ferroelectric capacitors successively connected to one another along a bit line direction each for storing a data in accordance with displacement of polarization of a ferroelectric film thereof and a reading transistor whose gate is connected to one end of the plurality of successively connected ferroelectric capacitors for reading a data by detecting the displacement of the polarization of the ferroelectric film of a selected ferroelectric capacitor selected from the plurality of ferroelectric capacitors; a set line connected to the other end of the plurality of successively connected ferroelectric capacitors; a bit line connected to a drain of the reading transistor at one end thereof; a reset line connected to a source of the reading transistor at one end thereof; and a plurality of word lines respectively corresponding to the plurality of ferroelectric capacitors and provided perpendicularly to the bit line for selecting the selected ferroelectric capacitor, and a step of reading a data from the selected ferroelectric capacitor includes sub-steps of applying a power voltage to the bit line and a ground voltage to the reset line, or applying the ground voltage to the bit line and the power voltage to the reset line, and detecting voltage change caused on the bit line by applying a reading voltage to the set line; and after detecting the voltage change, removing a potential difference caused between an upper electrode and a lower electrode of the selected ferroelectric capacitor by applying the ground voltage to the set line.

In the fifth method for driving a semiconductor memory, in reading a data from the selected ferroelectric capacitor, the data is read by applying the reading voltage to the set line, and then, the potential difference caused between the upper electrode and the lower electrode of the selected ferroelectric capacitor is removed. Therefore, the lowering of the potential difference through a resistance component of the ferroelectric capacitor can be avoided, resulting in improving the retention characteristic.

The fifth method for driving a semiconductor memory of this invention preferably further comprises, after the sub-step of removing the potential difference, a sub-step of turning off the reading transistor.

When the reading transistor is thus turned off after reading a data, no current flows between the bit line and the reset line. Therefore, similarly to the second method for driving a semiconductor memory, an operation for reading a data from a ferroelectric capacitor included in another memory cell block is not affected, so as to enlarge the operation margin in reading a data, resulting in realizing a stable operation.

In the sixth method for driving a semiconductor memory of this invention, the semiconductor memory contains a memory cell block including a plurality of ferroelectric capacitors successively connected to one another along a bit line direction each for storing a data in accordance with displacement of polarization of a ferroelectric film thereof and a reading transistor whose gate is connected to one end of the plurality of successively connected ferroelectric capacitors for reading a data by detecting the displacement of the polarization of the ferroelectric film of a selected ferroelectric capacitor selected from the plurality of ferroelectric capacitors; a set line connected to the other end of the plurality of successively connected ferroelectric capacitors; a bit line connected to a drain of the reading transistor at one end thereof and to one end of a load resistance at the other end thereof; a reset line connected to a source of the reading transistor at one end thereof; and a plurality of word lines respectively corresponding to the plurality of ferroelectric capacitors and provided perpendicularly to the bit line for selecting the selected ferroelectric capacitor, and a step of reading a data from the selected ferroelectric capacitor includes sub-steps of applying a power voltage to the other end of the load resistance and a ground voltage to the reset line, or applying the ground voltage to the other end of the load resistance and the ground voltage to the reset line, and comparing, with a reference voltage, voltage change caused at both ends of the load resistance owing to a current flowing between the drain and the source of the reading transistor in applying a reading voltage to the set line; and after comparing the voltage change, removing a potential difference caused between an upper electrode and a lower electrode of the selected ferroelectric capacitor by applying the ground voltage to the set line.

In the sixth method for driving a semiconductor memory, in reading a data from the selected ferroelectric capacitor, the voltage change caused at both ends of the load resistance connected to the bit line in applying the reading voltage to the set line is compared with the reference voltage. Therefore, a data written in the selected ferroelectric capacitor can be definitely read. Also, after reading a data from the selected ferroelectric capacitor, the potential difference caused between the upper electrode and the lower electrode of the selected ferroelectric capacitor is removed, and hence, the lowering of the potential difference through a resistance component of the ferroelectric capacitor can be avoided, resulting in improving the retention characteristic.

The sixth method for driving a semiconductor memory of this invention preferably further comprises, after the sub-step of removing the potential difference, a sub-step of turning off the reading transistor.

When the reading transistor is thus turned off after reading a data, no current flows between the bit line and the reset line. Therefore, similarly to the second method for driving a semiconductor memory, an operation for reading a data from a ferroelectric capacitor included in another memory cell block is not affected, so as to enlarge the operation margin in reading a data, resulting in realizing a stable operation.

In the sixth method for driving a semiconductor memory, the semiconductor memory preferably further includes a second memory cell block having the same configuration as the memory cell block and disposed on a side of the memory cell block along a word line direction; and a second bit line connected, at one end thereof, to a drain of a second reading transistor included in the second memory cell block and connected, at the other end thereof, to one end of a second load resistance, and it is preferred that the set line is connected to the other end of a plurality of ferroelectric capacitors included in the second memory cell block, that the reset line is connected to a source of the second reading transistor included in the second memory cell block, and that the reference voltage corresponds to voltage change caused at both ends of the second load resistance owing to a current flowing between the drain and the source of the second reading transistor in applying the power voltage to the other end of the second load resistance and the ground voltage to the reset line, or applying the ground voltage to the other end of the second load resistance and the ground voltage to the reset line, and applying the reading voltage to the set line.

In this manner, the first voltage change caused at both ends of the former load resistance owing to a current flowing between the drain and the source of the reading transistor included in the memory cell block where a data is read is compared with the second voltage change caused at both ends of the latter load resistance owing to a current flowing between the drain and the source of the second reading transistor included in the second memory cell block where a data is not read. Thus, a data written in the selected ferroelectric capacitor included in the memory cell block where the data is read can be definitely detected.

DETAILED DESCRIPTION OF THE INVENTION

Embodiment 1

A semiconductor memory and a method for driving the semiconductor memory according to Embodiment 1 of the invention will now be described with reference to FIGS. 1A and 1B.

Figure 1A:
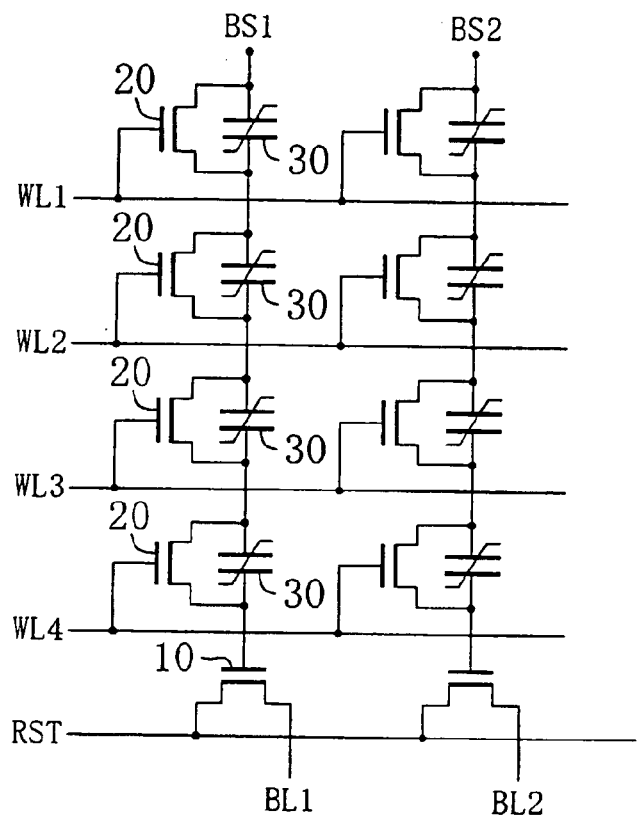
FIG. 1A is an equivalent circuit diagram of a semiconductor memory according to Embodiment 1 of the invention.

FIG. 1A is an equivalent circuit diagram of the semiconductor memory of Embodiment 1, and a ferroelectric capacitor 30 for storing a data in accordance with displacement of the polarization of the ferroelectric film thereof and a selecting field effect transistor (hereinafter simply referred to as the selecting transistor) 20 connected to the ferroelectric capacitor 30 in parallel together form a memory cell.

A plurality of ferroelectric capacitors 30 are successively connected along a bit line direction so as to form a series circuit, and the lower end of the series circuit is connected to a reading field effect transistor (hereinafter simply referred to as the reading transistor) 10 for reading a data by detecting the displacement of the polarization of the ferroelectric film of one ferroelectric capacitor 30 selected from the plural ferroelectric capacitors 30. The plural ferroelectric capacitor 30, the corresponding plural selecting transistors 20 and one reading transistor 10 together form a memory cell block. A plurality of memory cell blocks each having the same configuration are arranged along a direction perpendicular to the bit line direction (namely, along a word line direction), so as to form a memory cell array.

Figure 1B:
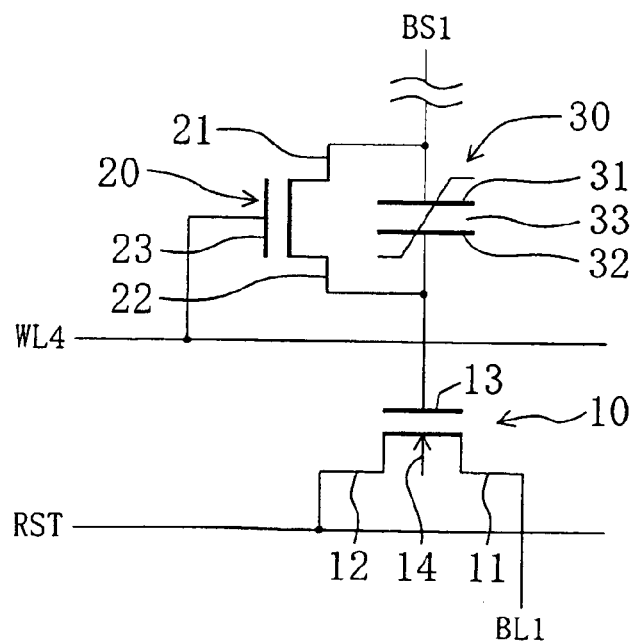
FIG. 1B is an equivalent circuit diagram for showing the configuration of a memory cell on the lowermost row and a reading transistor included in the semiconductor memory of Embodiment 1.

FIG. 1B shows the configuration of the memory cell on the lowermost row and the reading transistor 10. The reading transistor 10 has a drain region 11, a source region 12 and a gate electrode 13, the selecting transistor 20 has a drain region 21, a source region 22 and a gate electrode 23, and the ferroelectric capacitor 30 has an upper electrode 31, a lower electrode 32 and a ferroelectric film 33. In FIG. 1B, a reference numeral 14 denotes a substrate where the reading transistor 10 is formed.

As shown in FIGS. 1A and 1B, the gate electrodes 23 of the selecting transistors 20 included in the memory cells on the first row are connected to a first word line WL1, the gate electrodes 23 of the selecting transistors 20 included in the memory cells on the second row are connected to a second word line WL2, the gate electrodes 23 of the selecting transistors 20 included in the memory cells on the third row are connected to a third word line WL3, and the gate electrodes 23 of the selecting transistors 20 included in the memory cells on the fourth row are connected to a fourth word line WL4.

In the memory cell block in the first column, the upper end of the series circuit including the plural ferroelectric capacitors 30 in the first column successively connected to one another along the bit line direction, namely, the upper electrode 31 of the ferroelectric capacitor 30 on the first row, is connected to a first control line (first set line) BS1, and the lower end of the series circuit, namely, the lower electrode 32 of the ferroelectric capacitor 30 on the fourth row, is connected to the gate electrode 13 of the reading transistor 10. The drain region 11 of the reading transistor 10 is connected to a first bit line BL1.

In the memory cell block in the second column, the upper end of the series circuit including the plural ferroelectric capacitors 30 in the second column successively connected to one another along the bit line direction, namely, the upper electrode 31 of the ferroelectric capacitor 30 on the first row, is connected to a second control line (second set line) BS2, and the lower end of the series circuit, namely, the lower electrode 32 of the ferroelectric capacitor 30 on the fourth row, is connected to the gate electrode 13 of the reading transistor 10. The drain region 11 of the reading transistor 10 is connected to a second bit line BL2.

The source region 12 of the reading transistor 10 in the first column and the source region 12 of the reading transistor 10 in the second column are connected to a reset line RST.

(Data Write Operation)

A write operation of the semiconductor memory of Embodiment 1 is carried out as follows, in which a write operation for writing a data in the ferroelectric capacitor 30 included in the memory cell in the first column and on the fourth row will be exemplified:

First, the substrate potential of all the reading transistors 10 is set to a ground voltage VSS (of 0 V), and the potentials of the first and second control lines BS1 and BS2 and the first through fourth word lines WL1 through WL4 are set to the ground voltage VSS. Thereafter, the potential of the first control line BS1 is increased to a power voltage VDD (of 5 V).

Next, the potentials of the first through third word lines WL1 through WL3 are increased to the power voltage VDD, with the potential of the fourth word line WL4 kept at the ground voltage.

In this manner, the selecting transistors 10 on the first through third rows whose gates are connected to the first through third word lines WL1 through WL3 are turned on, and the selecting transistor 10 on the fourth row whose gate is connected to the fourth word line WL4 is kept in an off-state. Thus, the ferroelectric capacitor 30 included in the memory cell in the first column and on the fourth row is selected.

Furthermore, a potential difference between the power voltage VDD and the ground voltage VSS is applied between the upper electrode 31 and the lower electrode 32 of the ferroelectric capacitor 30 included in the memory cell in the first column and on the fourth row. Therefore, downward polarization is caused in the ferroelectric film 33 of this ferroelectric capacitor 30, so that a data "1" can be written in this ferroelectric capacitor 30. When the potential of the first control line BS1 is lowered from the ground voltage to a negative voltage (of −5 V), the data "1" written in the ferroelectric capacitor 30 included in the memory cell in the first column and on the fourth row is erased, and thus, the logical state of the ferroelectric capacitor 30 corresponds to a data "0".

(Data Read Operation)

A read operation of the semiconductor memory of Embodiment 1 is carried out as follows, in which a read operation for reading a data from the ferroelectric capacitor 30 in the first column and on the fourth row is exemplified:

First, the substrate potential of all the reading transistors 10 is set to the ground voltage VSS (of 0 V), and the potentials of the first and second control lines BS1 and BS2 and the first through fourth word lines WL1 through WL4 are set to the ground voltage VSS. Thereafter, the potential of the first control line BS1 is increased to the power voltage VDD (of 5 V).

Next, the potentials of the first through third word lines WL1 through WL3 are increased to the power voltage, with the potential of the fourth word line WL4 kept at the ground voltage.

In this manner, the selecting transistors 10 on the first through third rows whose gates are connected to the first through third word lines WL1 through WL3 are turned on, and the selecting transistor 10 on the fourth row whose gate is connected to the fourth word line WL4 is kept in an off-state. Thus, the ferroelectric capacitor 30 included in the memory cell in the first column and on the fourth row is selected.

Under this condition, the potential of the first bit line BL1 is set to the power voltage VDD and the potential of the reset line RST is set to the ground voltage VSS. When a data "1" is stored, a current flows between the drain region 11 and the source region 12 of the reading transistor 10, and when a data "0" is stored, no current flows between the drain region 11 and the source region 12 of the reading transistor 10. Thus, a data written in the ferroelectric capacitor 30 included in the memory cell in the first column and on the fourth row can be read.

When data read is completed, the potential of the fourth word line WL4 is increased to the power voltage, so as to turn on the selecting transistor 10 on the fourth row whose gate electrode is connected to the fourth word line WL4. In this manner, the upper electrode 31 and the lower electrode 32 of the ferroelectric capacitor 30 from which the data has been read are electrically connected, resulting in removing the potential difference caused between the upper electrode 31 and the lower electrode 32.

In Embodiment 1, the gate electrode 13 of the reading transistor 10 for detecting the displacement of the polarization of the ferroelectric film 33 of the selected ferroelectric capacitor 30 is connected to one end of the plural ferroelectric capacitors 30 successively connected to one another along the bit line direction. Therefore, there is no need to provide a reading transistor in every memory cell, resulting in reducing not only the area of each memory cell but also the area of the entire semiconductor memory.

Furthermore, the first through fourth word lines WL1 through WL4 provided perpendicularly to the bit lines are used for selecting the ferroelectric capacitor 30 for writing a data in or reading a data from. Therefore, even though merely one reading transistor 10 is connected to the plural successively connected ferroelectric capacitors 30, data write or data read can be definitely carried out in the selected ferroelectric capacitor 30.

Also, in reading a data, the amplifying function of the reading transistor 10 can be utilized, so that the sensitivity for detecting the displacement of the polarization of the ferroelectric film 33 of the selected ferroelectric capacitor 30 can be improved.

Moreover, since the potential difference caused between the upper electrode 31 and the lower electrode 32 of the ferroelectric capacitor 30 is removed after reading a data, the lowering of the potential difference through a resistance component of the ferroelectric capacitor 30 can be avoided, resulting in improving the retention characteristic.

Embodiment 2

A semiconductor memory and a method for driving the semiconductor memory according to Embodiment 2 of the invention will now be described with reference to FIGS. 2 through 4.

In the semiconductor memory of Embodiment 1, in order to store a data "0" in the ferroelectric capacitor 30 of the selected memory cell after writing a data "1" therein and erasing the data "1", it is necessary to apply a voltage negative with respect to the substrate 14 of the reading transistor 10 to the first control line BS1 or to apply a voltage positive with respect to the first control line BS1 to the substrate 14 of the reading transistor 10.

Accordingly, in the former case, it is necessary to provide a negative voltage generator, and in the latter case, it is necessary to finely divide the well region so as to specifically control the potential of the substrate of each memory cell.

Furthermore, in the semiconductor memory of Embodiment 1, in the case where, for example, a positive voltage is applied to the gate electrode 13 of the reading transistor 10 in reading a data, when the selected ferroelectric capacitor 30 stores a data "1", the positive voltage enhances the polarization of the ferroelectric film 33, but when the ferroelectric capacitor 30 stores a data "0", the positive voltage partially reverses the polarization of the ferroelectric film 33. Accordingly, a data may be disadvantageously disappeared when a read operation is repeatedly carried out.

Moreover, a data is detected depending upon whether or not a current flows between the drain region 11 and the source region 12 of the reading transistor 10 in accordance with the direction of the polarization of the ferroelectric film 33 of the ferroelectric capacitor 30. At this point, how voltage change caused by the current between the drain region 11 and the source region 12 is compared with a reference voltage and how the reference voltage is generated become new problems.

The semiconductor memory and the driving method of Embodiment 2 overcome such problems arising in Embodiment 1.

Figure 2:
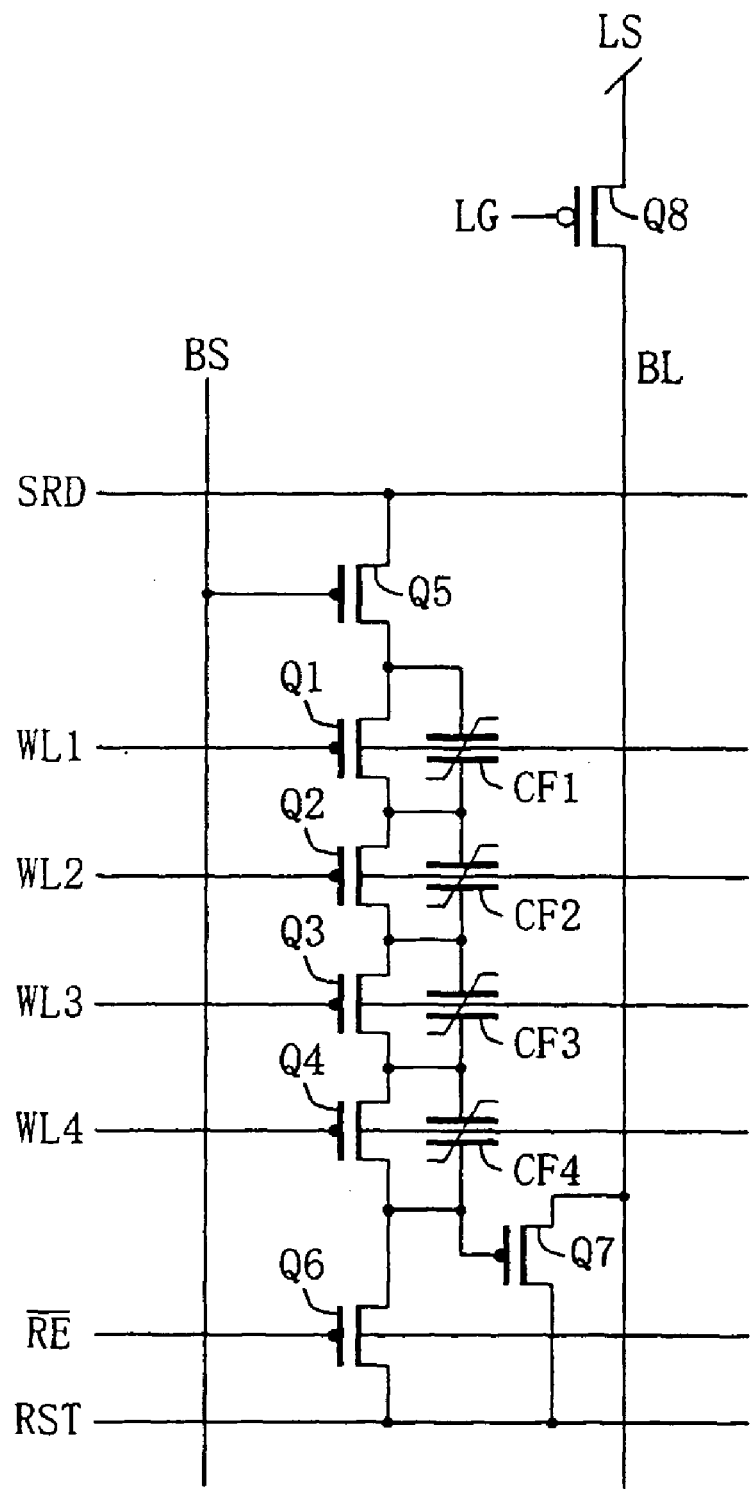
FIG. 2 is an equivalent circuit diagram of a semiconductor memory according to Embodiment 2 of the invention.

FIG. 2 is an equivalent circuit diagram of the semiconductor memory of this embodiment. One memory cell block includes a plurality of successively connected ferroelectric capacitors CF1, CF2, CF3 and CF4, a plurality of successively connected cell selecting field effect transistor (hereinafter simply referred to as the cell selecting transistors) Q1, Q2, Q3 and Q4 respectively connected to the ferroelectric capacitors in parallel, and a reading field effect transistor (hereinafter simply referred to as the reading transistor) Q7 whose gate is connected to one end of the successively connected plural ferroelectric capacitors.

The first ferroelectric capacitor CF1 and the first cell selecting transistor Q1 together form a first memory cell, the second ferroelectric capacitor CF2 and the second cell selecting transistor Q2 together form a second memory cell, the third ferroelectric capacitor CF3 and the third cell selecting transistor Q3 together form a third memory cell, and the fourth ferroelectric capacitor CF4 and the fourth cell selecting transistor Q4 together form a fourth memory cell.

The lower end of the successively connected plural cell selecting transistors is connected to a reset line RST through a read selecting field effect transistor (hereinafter simply referred to as the read selecting transistor) Q6. The upper end of the successively connected plural ferroelectric capacitors and the upper end of the successively connected plural cell selecting transistors are connected to a set line SRD through a block selecting field effect transistor (hereinafter simply referred to as the block selecting transistor) Q5. The cell selecting transistors Q1 through Q4, the block selecting transistor Q5, the read selecting transistor Q6 and the reading transistor Q7 are all N-channel transistors.

The gate of the first cell selecting transistor Q1 is connected to a first word line WL1, the gate of the second cell selecting transistor Q2 is connected to a second word line WL2, the gate of the third cell selecting transistor Q3 is connected to a third word line WL3, and the gate of the fourth cell selecting transistor Q4 is connected to a fourth word line WL4.

The gate of the reading transistor Q7 is connected to the reset line RST through the read selecting transistor Q6, the drain of the reading transistor Q7 is connected to the lower end of a bit line BL, and the source of the reading transistor Q7 is connected to the reset line RST.

The gate of the block selecting transistor Q5 is connected to a block selecting line BS, and the gate of the read selecting transistor Q6 is connected to a read selecting line /RE. The lowermost end of the bit line BL is connected to an operation amplifier including a sense amplifier (not shown).

The upper end of the bit line BL is connected to the drain of a P-channel field effect transistor (hereinafter referred to as the load transistor) Q8 serving as a load resistance. The source of the load transistor Q8 is connected to a first control line LS and the gate of the load transistor Q8 is connected to a second control line LG.

In Embodiment 2, voltages applied to the first through fourth word lines WL1 through WL4 for selecting one of the first through fourth ferroelectric capacitors CF1 through CF4 for data write or data read and a voltage applied to the set line SRD or the reset line RST for writing a data in a selected ferroelectric capacitor are always a power voltage VDD (of, for example, 5 V) or a ground voltage VSS (of, for example, 0 V).

Also in Embodiment 2, the potential of the read selecting line /RE is set to the ground voltage VSS in a read operation and to the power voltage VDD in operations other than a read operation. Accordingly, the read selecting transistor Q6 is in an off-state merely in a read operation, so that a current can flow from a selected ferroelectric capacitor to the gate of the reading transistor Q7, and is always in an on-state in operations other than a read operation, so that the set line SRD and the reset line RST can be connected to each other through a selected ferroelectric capacitor as a preparation for write and erase operations.

Therefore, in a data read operation, in the case where none of the ferroelectric capacitors included in this memory cell block is selected, no voltage is applied to the gate of the reading transistor Q7 and hence the reading transistor Q7 is in an off-state. Accordingly, no current flows between the bit line BL connected to this memory cell block and the reset line RST. As a result, in reading a data from a ferroelectric capacitor included in another memory cell block, even when a voltage is applied between the upper electrode and the lower electrode of the ferroelectric capacitor included in this memory cell block, this voltage application does not prevent the data read from a ferroelectric capacitor of another memory cell block.

(Data Write Operation)

A write operation for writing a data "1" in the ferroelectric capacitor CF4 on the fourth row will now be described.

First, the potential of the block selecting line BS is set to the power voltage VDD, so as to turn on the block selecting transistor Q5.

Next, the potentials of the first through third word lines WL1 through WL3 connected to the gates of the first through third cell selecting transistors Q1 through Q3 included in the first through third memory cells in which a data is not written are set to the power voltage VDD, so as to turn on the first through third cell selecting transistors Q1 through Q3. The potential of the fourth word line WL4 connected to the gate of the fourth cell selecting transistor Q4 is set to the ground voltage VSS, so as to turn off the fourth cell selecting transistor Q4.

In this manner, the upper electrode of the selected fourth ferroelectric capacitor CF4 is connected to the set line SRD and the lower electrode thereof is connected to the reset line RST.

Then, with the potential of the reset line RST kept at the ground voltage VSS, the potential of the set line SRD is increased to the power voltage VDD.

In this manner, a potential difference of +(VDD−VSS) is caused between the upper electrode and the lower electrode of the fourth ferroelectric capacitor CF4, and hence, downward polarization is caused in the ferroelectric film of the fourth ferroelectric capacitor CF4, resulting in writing a data "1" in the fourth ferroelectric capacitor CF4.

Thereafter, the potential of the set line SRD is set to the ground voltage VSS, so as to remove the potential difference of +(VDD−VSS) caused between the upper electrode and the lower electrode of the fourth ferroelectric capacitor CF4.

Now, behavior of the ferroelectric capacitor obtained when the potential difference caused between the upper electrode and the lower electrode thereof is removed after writing a data "1" in the aforementioned manner will be described with reference to FIG. 3.

Figure 3:
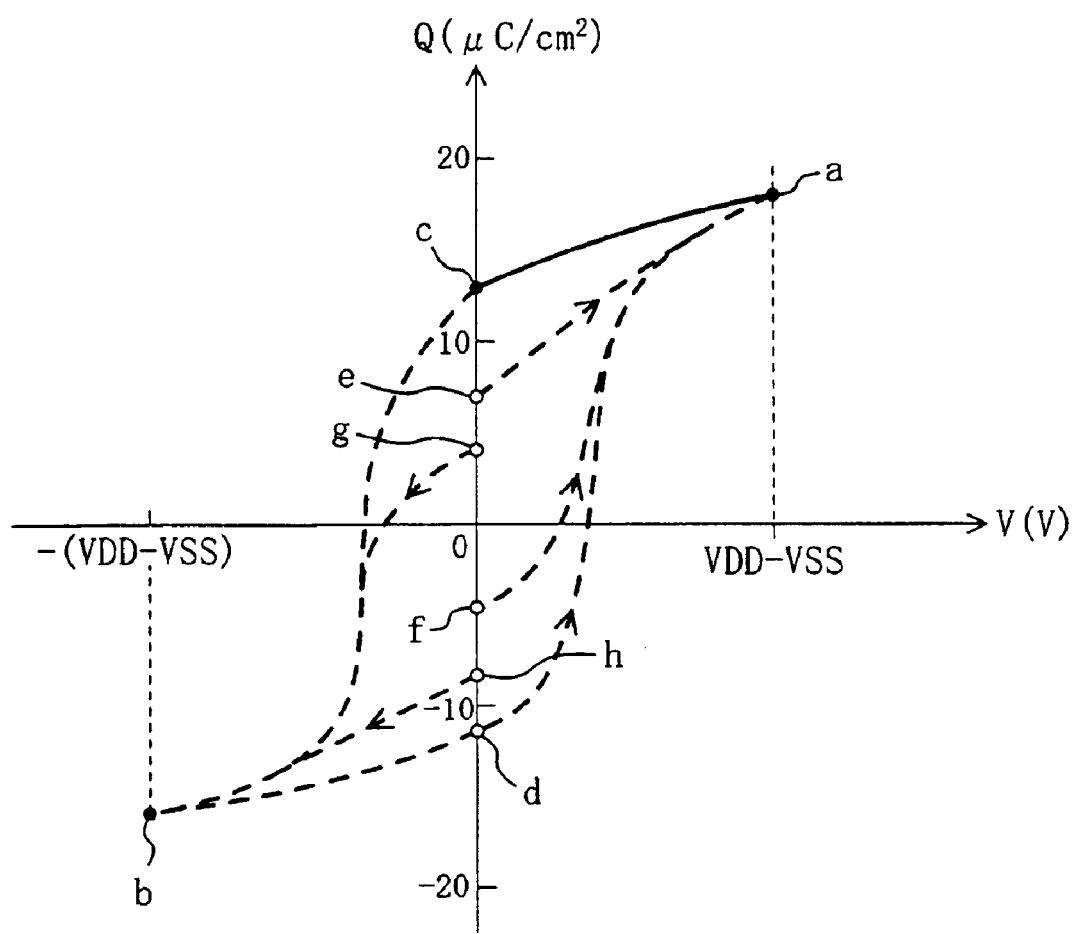
FIG. 3 is a diagram for explaining behavior of a ferroelectric capacitor obtained when a potential difference caused between the upper electrode and the lower electrode of the ferroelectric capacitor is removed after writing a data in the semiconductor memory of Embodiment 2.

In FIG. 3, the ordinate indicates charge Q charged to, discharged from and stored in the ferroelectric film of the ferroelectric capacitor, and the abscissa indicates a voltage applied between the upper electrode and the lower electrode of the ferroelectric capacitor. Also in FIG. 3, a point a corresponds to polarization charge obtained by applying a voltage of +(VDD−VSS) to the ferroelectric capacitor, a point b corresponds to polarization charge obtained by applying a voltage of −(VDD−VSS) to the ferroelectric capacitor, a point c corresponds to polarization charge obtained immediately after removing the voltage of +(VDD−VSS) applied to the ferroelectric capacitor, and a point d corresponds to polarization charge obtained immediately after removing the voltage −(VDD−VSS) applied to the ferroelectric capacitor. In all the cases, a data "1" is written.

Since a potential difference between the electrodes of the ferroelectric capacitor is zero before starting a write operation, the polarization of the selected ferroelectric capacitor is located at a point between the points c and d. For example, when the polarization of the ferroelectric capacitor is located at a point e, the polarization moves from the point e to the point a through a write operation and reaches the point c. Alternatively, for example, when the polarization of the ferroelectric capacitor is located at a point f, the polarization moves from the point f to the point a through a write operation and reaches the point c. In this manner, when a data "1" is written in the ferroelectric capacitor, the position of the polarization moves to the point c regardless of the position thereof obtained before the write operation.

(Data Erase Operation)

An operation for erasing a data "1" written in the ferroelectric capacitor CF4 on the fourth row, namely, an operation for rewriting a data "1" to a data "0", will now be described.

First, the potential of the block selecting line BS is set to the power voltage VDD, so as to turn on the block selecting transistor Q5.

Next, the potentials of the first through third word lines WL1 through WL3 connected to the gates of the first through third cell selecting transistors Q1 through Q3 included in the first through third memory cells where a data is not written are set to the power voltage VDD, so as to turn on the first through third cell selecting transistors Q1 through Q3. The potential of the fourth word line WL4 connected to the gate of the fourth cell selecting transistor Q4 is set to the ground voltage VSS, so as to turn off the fourth cell selecting transistor Q4.

In this manner, the upper electrode of the fourth ferroelectric capacitor CF4 included in the selected fourth memory cell is connected to the set line SRD and the lower electrode thereof is connected to the reset line RST.

Then, with the potential of the set line SRD kept at the ground voltage VSS, the potential of the reset line RST is increased to the power voltage VDD.

In this manner, a potential difference of −(VDD−VSS) is caused between the upper electrode and the lower electrode of the fourth ferroelectric capacitor CF4, so as to cause upward polarization in the ferroelectric film of the fourth ferroelectric capacitor CF4. Thus, a data "0" is written in the fourth ferroelectric capacitor CF4.

Thereafter, the potential of the reset line RST is set to the ground voltage VSS, so as to remove the potential difference of −(VDD−VSS) caused between the upper electrode and the lower electrode of the fourth ferroelectric capacitor CF4.

Now, behavior of the ferroelectric capacitor obtained when the potential difference caused between the upper electrode and the lower electrode thereof is removed after writing a data "0" in the aforementioned manner will be described with reference to FIG. 3.

Since a potential difference between the electrodes of the ferroelectric capacitor is zero before writing a data "0", namely, before erasing a data "1", the polarization of the selected ferroelectric capacitor is located at a point between the points c and d. For example, when the polarization of the ferroelectric capacitor is located at a point g, the polarization moves from the point g to the point b through an erase operation and reaches the point d. Alternatively, for example, when the polarization of the ferroelectric capacitor is located at a point h, the polarization moves from the point h to the point b through an erase operation and reaches the point d. In this manner, when a data "1" written in the ferroelectric capacitor is erased, the position of the polarization moves to the point d regardless of the position thereof obtained before the erase operation.

(Data Read Operation)

An operation for reading a data written in the ferroelectric capacitor CF4 on the fourth row will now be described.

First, the potential of the block selecting line BS is set to the power voltage VDD, so as to turn on the block selecting transistor Q5.

Nest, the potentials of the first through third word lines WL1 through WL3 connected to the gates of the first through third cell selecting transistors Q1 through Q3 included in the first through third memory cells where a data is not read are set to the power voltage VDD, so as to turn on the first through third cell selecting transistors Q1 through Q3. The potential of the fourth word line WL4 connected to the gate of the fourth cell selecting transistor Q4 is set to the ground voltage VSS, so as to turn off the fourth cell selecting transistor Q4.

In this manner, the upper electrode of the fourth ferroelectric capacitor CF4 included in the selected fourth memory cell is connected to the set line SRD, and the lower electrode thereof is connected to the reset line RST.

Next, the potential of the read selecting line /RE is set to the ground voltage VSS, so as to turn off the reading transistor Q6. Thereafter, the potential of the first control line LS connected to the source of the load transistor Q8 is set to the power voltage VDD and the potential of the second control line LG connected to the gate of the load transistor Q8 is set to the ground voltage VSS, so as to turn on the load transistor Q8.

Then, with the potential of the reset line RST kept at the ground voltage VSS, the potential of the set line SRD is set to a reading voltage VRD, so that a difference between voltage change caused on the bit line BL owing to a current flowing to the reading transistor Q7 and a reference voltage VREF can be detected by the sense amplifier to be output.

Subsequently, the potential of the set line SRD is lowered to the ground voltage VSS, and the potential of the read selecting line /RE is set to the power voltage VDD, so as to turn on the read selecting transistor Q6.

Now, the amplitude of the reading voltage VRD will be examined.

When the potential of the set line SRD is set to the reading voltage VRD, the reading voltage VRD is divided between a first division voltage and a second division voltage on the basis of a ratio between the capacitance of the fourth ferroelectric capacitor CF4 and the gate capacitance of the reading transistor Q7. The first division voltage is induced to the gate of the reading transistor Q7, and the second division voltage is induced between the upper electrode and the lower electrode of the fourth ferroelectric capacitor CF4.

In assuming that the threshold voltage of the reading transistor Q7 is VT, that a first division voltage induced to the gate of the reading transistor Q7 when the fourth ferroelectric capacitor CF4 stores a data "1" is VS, and that a first division voltage induced to the gate of the reading transistor Q7 when the fourth ferroelectric capacitor CF4 stores a data "0" is VR, the reading voltage VRD is set to such magnitude that a relationship of VR>VT>VS holds.

In this manner, in reading a data "1" or a data "0" stored in the fourth ferroelectric capacitor CF4 with the reading transistor Q7, a ratio in the current value of a current flowing between the drain and the source of the reading transistor Q7 can be preferably enlarged.

Now, the aforementioned read operation will be described in detail with reference to FIG. 4 with respect to each of the cases where a data "1" is stored and where a data "0" is stored. In FIG. 4, the ordinate indicates charge Q charged to, discharged from and stored in the ferroelectric film of the ferroelectric capacitor CF4, and the abscissa indicates a voltage applied to a series circuit of the capacitance of the ferroelectric capacitor CF4 and the gate capacitance of the reading transistor Q7.

<Read Operation Conducted in Storing a Data "1">

First, the potential of the substrate where the reading transistor Q7 is formed is set to the ground voltage VSS.

When a data "1" is stored in the fourth ferroelectric capacitor CF4, the polarization charge of the fourth ferroelectric capacitor CF4 is located at a point p.

Next, through the operation for selecting the memory cell (the ferroelectric capacitor) described above, the upper electrode of the fourth ferroelectric capacitor CF4 is connected to the set line SRD, the lower electrode thereof is connected to the reset line RST, the potential of the read selecting line /RE is set to the ground voltage VSS so as to turn off the read selecting transistor Q6, and the potential of the first control line LS is set to the power voltage VDD.

Under this condition, with the potential of the reset line RST kept at the ground voltage VSS, the potential of the set line SRD is set to the reading voltage VRD. Thus, a voltage VRD–VSS is applied between the set line RSD and the substrate of the reading transistor Q7, namely, the voltage VRD–VSS is applied to the series circuit of the capacitance of the fourth ferroelectric capacitor CF4 and the gate capacitance of the reading transistor Q7 connected to each other in series.

This operation will be described with reference to FIG. 4.

When the voltage VRD–VSS is applied to the series circuit of the capacitance of the fourth ferroelectric capacitor CF4 and the gate capacitance of the reading transistor Q7, the voltage VRD–VSS is divided between a first division voltage VS ranging from a point r to a point s and generated between the gate of the reading transistor Q7 and the substrate; and a second division voltage VRD–VSS–VS ranging from the point p to the point s and generated between the upper electrode and the lower electrode of the fourth ferroelectric capacitor CF4.

Figure 4:
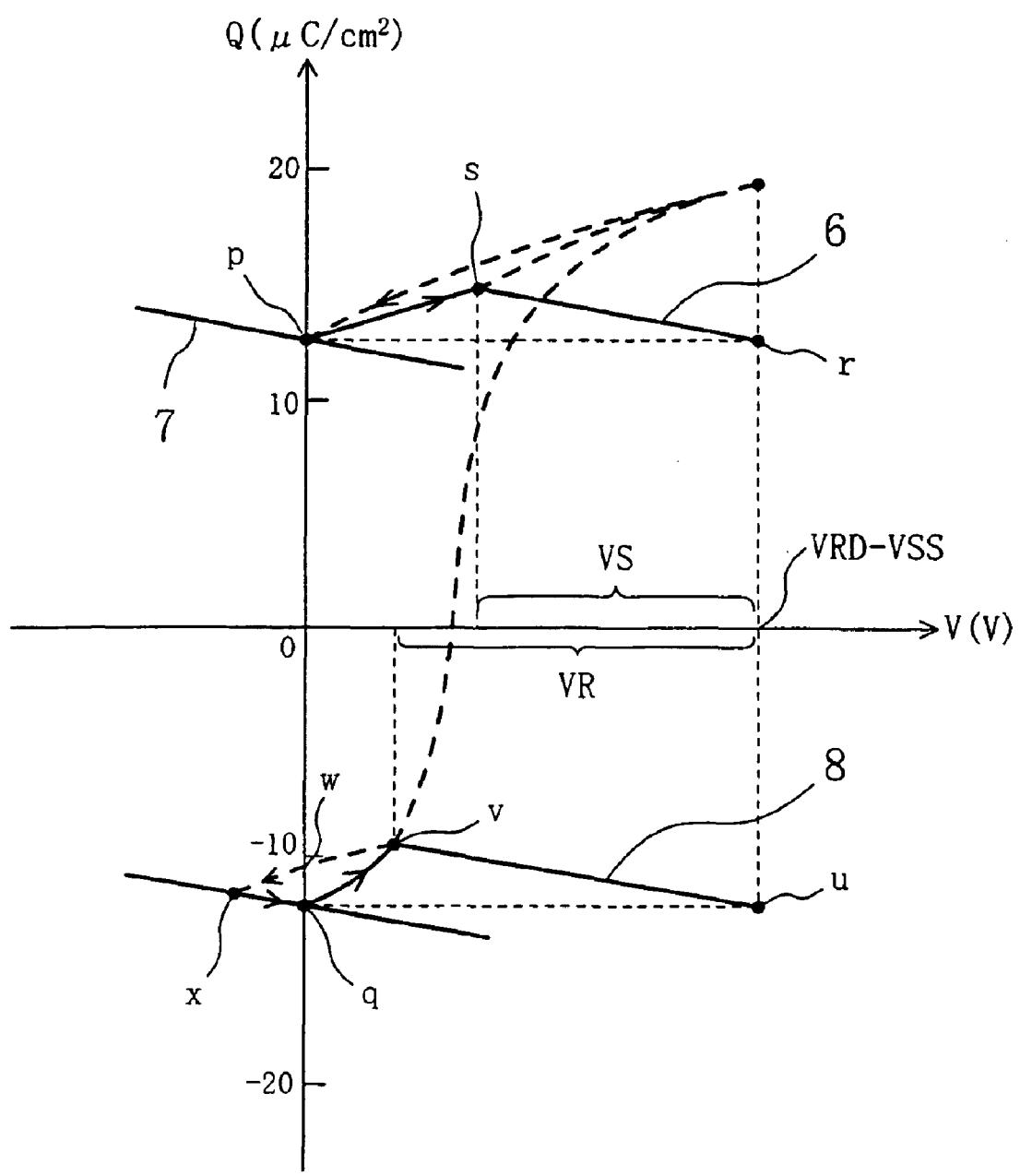
FIG. 4 is a diagram for explaining behavior of a ferroelectric capacitor obtained when a data is read from the semiconductor memory of Embodiment 2.

In FIG. 4, a reference numeral 6 denotes a gate capacitance load line of the reading transistor Q7 in an operation for reading a data "1", and the position of the point s, namely, the magnitude of the first division voltage VS, depends upon the magnitude of the gate capacitance of the reading transistor Q7 in the read operation. Also, the first division voltage VS determines channel conductance of the reading transistor Q7 in reading a data "1".

When a capacitance ratio between the capacitance of the fourth ferroelectric capacitor CF4 and the gate capacitance of the reading transistor Q7 is set so that a relationship of VT>VS can hold between the threshold voltage VT of the reading transistor Q7 and the first division voltage VS obtained when a data "1" is stored, a current flowing from the reset line RST through the load transistor Q8, the bit line BL and the channel of the reading transistor Q7 to the reset line RST is comparatively small, and hence, the voltage change on the bit line BL can be made small. This voltage change is detected by the sense amplifier connected to the bit line BL, so as to compare the detected voltage change with a previously determined reference voltage. When the detected voltage change does not exceed the reference voltage, it is determined that a data "1" is stored.

Next, when the potential of the set line SRD is restored to the ground voltage VSS, the polarization charge of the fourth ferroelectric capacitor CF4 moves along the substantially outermost circumference of the hysteresis loop to return to the point p, and a gate capacitance load line 7 of the reading transistor Q7 crosses the ordinate at the point p.

Thereafter, even when the potential of the read selecting line /RE is set to the power voltage VDD so as to turn on the read selecting transistor Q6, the voltage applied to the fourth ferroelectric capacitor CF4 is zero, and hence, the magnitude of the polarization charge stored in the fourth ferroelectric capacitor CF4 after reading a data "1" is minimally different from the magnitude of the polarization charge obtained before reading a data "1".

<Read Operation Conducted in Storing a Data "0">

When a data "0" is stored in the fourth ferroelectric capacitor CF4, the polarization charge of the fourth ferroelectric capacitor CF4 is located at a point q.

Through the operation for selecting the memory-cell (the ferroelectric capacitor) described above, the upper electrode of the fourth ferroelectric capacitor CF4 is connected to the set line SRD, the lower electrode thereof is connected to the reset line RST, the potential of the read selecting line /RE is set to the ground voltage VSS so as to turn off the read selecting transistor Q6, and the potential of the first control line LS is set to the power voltage VDD.

Under this condition, with the potential of the reset line RST kept at the ground voltage VSS, the potential of the set line SRD is set to the reading voltage VRD. Thus, a voltage VRD−VSS is applied between the set line SRD and the substrate of the reading transistor Q7, namely, the voltage VRD−VSS is applied to the series circuit of the capacitance of the fourth ferroelectric capacitor CF4 and the gate capacitance of the reading transistor Q7 connected to each other in series.

When the voltage VRD−VSS is applied to the series circuit of the capacitance of the fourth ferroelectric capacitor CF4 and the gate capacitance of the reading transistor Q7, the voltage VRD−VSS is divided between a first division voltage VR ranging from a point u to a point v and generated between the gate of the reading transistor Q7 and the substrate; and a second division voltage VRD−VSS−VR ranging from the point q to the point v and generated between the upper electrode and the lower electrode of the fourth ferroelectric capacitor CF4.

In FIG. 4, a reference numeral 8 denotes a gate capacitance load line of the reading transistor Q7 in an operation for reading a data "0", and the position of the point v, namely, the magnitude of the first division voltage VR, depends upon the magnitude of the gate capacitance of the reading transistor Q7 in the read operation. Also, the first division voltage VR determines channel conductance of the reading transistor Q7 in reading a data "0".

When a capacitance ratio between the capacitance of the fourth ferroelectric capacitor CF4 and the gate capacitance of the reading transistor Q7 is set so that a relationship of VR>VT can hold between the threshold voltage VT of the reading transistor Q7 and the first division voltage VR obtained when a data "0" is stored, a current flowing from the reset line RST through the load transistor Q8, the bit line BL and the channel of the reading transistor Q7 to the reset line RST is comparatively large, and hence, the voltage change on the bit line BL can be made large. This voltage change is detected by the sense amplifier connected to the bit line BL, so as to compare the detected voltage change with a previously determined reference voltage. When the detected voltage change exceeds the reference voltage, it is determined that a data "0" is stored.

Thereafter, when the reading transistor Q6 is turned on by setting the potential of the read selecting line /RE to the power voltage VDD so as to make the voltage applied to the fourth ferroelectric capacitor CF4 zero, the polarization charge of the ferroelectric capacitor CF4 moves along an inside region of the hysteresis loop to reach a point w. The magnitude of the polarization charge stored in the fourth ferroelectric capacitor CF4 after reading a data "0" is obviously smaller than the magnitude of the polarization charge obtained before reading a data "0".

Therefore, before turning on the read selecting transistor Q6 so as to make the voltage applied to the fourth ferroelectric capacitor CF4 zero, the voltage of the set line SRD is forcedly restored to the ground voltage VSS. In this manner, although the polarization charge of the fourth ferroelectric capacitor CF4 moves along the inside region of the hysteresis loop, a gate capacitance load line 8 of the reading transistor Q7 affects the fourth ferroelectric capacitor CF4 so as to cross the ordinate at the point q. Therefore, the polarization charge quickly moves from the point v to a point x.

At this point, since the gradient of the gate capacitance load line of the reading transistor Q7 is set to be sufficiently small, although the polarization charge at the point x is slightly smaller than the polarization charge at the point q, the magnitude of the polarization charge at the point x is substantially the same as the magnitude of the polarization charge at the point q. Accordingly, even when the read selecting transistor Q6 is turned on by setting the potential of the read selecting line /RE to the power voltage VDD so as to make the voltage applied to the fourth ferroelectric capacitor CF4 zero thereafter, the magnitude of the polarization charge stored in the fourth ferroelectric capacitor CF4 after reading a data "0" is minimally different from the magnitude of the polarization charge obtained before reading a data "0".

Although the polarization charge is merely slightly lowered through one operation for reading a data "0", when the read operation is repeated a large number of times, the polarization charge at the point q may move toward the point p. However, since the voltage VRD−VSS−VR applied to the fourth ferroelectric capacitor CF4 in reading a data "0", namely, the magnitude of the voltage from the point q to the point v, is set so as not to exceed the coercive voltage VC of the fourth ferroelectric capacitor CF4, the polarization charge at the point q never moves to a point above the origin o even if the operation for reading a data "0" is repeated a large number of times.

The capacitance ratio between the capacitance of the fourth ferroelectric capacitor CF4 and the gate capacitance of the reading transistor Q7 can be set so that the relationship of VR>VT>VS can hold without allowing the voltage VRD−VSS−VR applied to the fourth ferroelectric capacitor CF4 to exceed the coercive voltage VC of the fourth ferroelectric capacitor CF4.

The above description is applied not only to the fourth ferroelectric capacitor CF4 but also to any of the other ferroelectric capacitors.

Although one memory cell block is composed of four memory cells in this embodiment, the number of memory cells included in one memory cell block can be optionally set.

Now, a circuit for generating the reference voltage used for determining whether a data "1" or a data "0" is stored through comparison with the voltage change on the bit line BL will be described with reference to FIG. 5.

Figure 5:
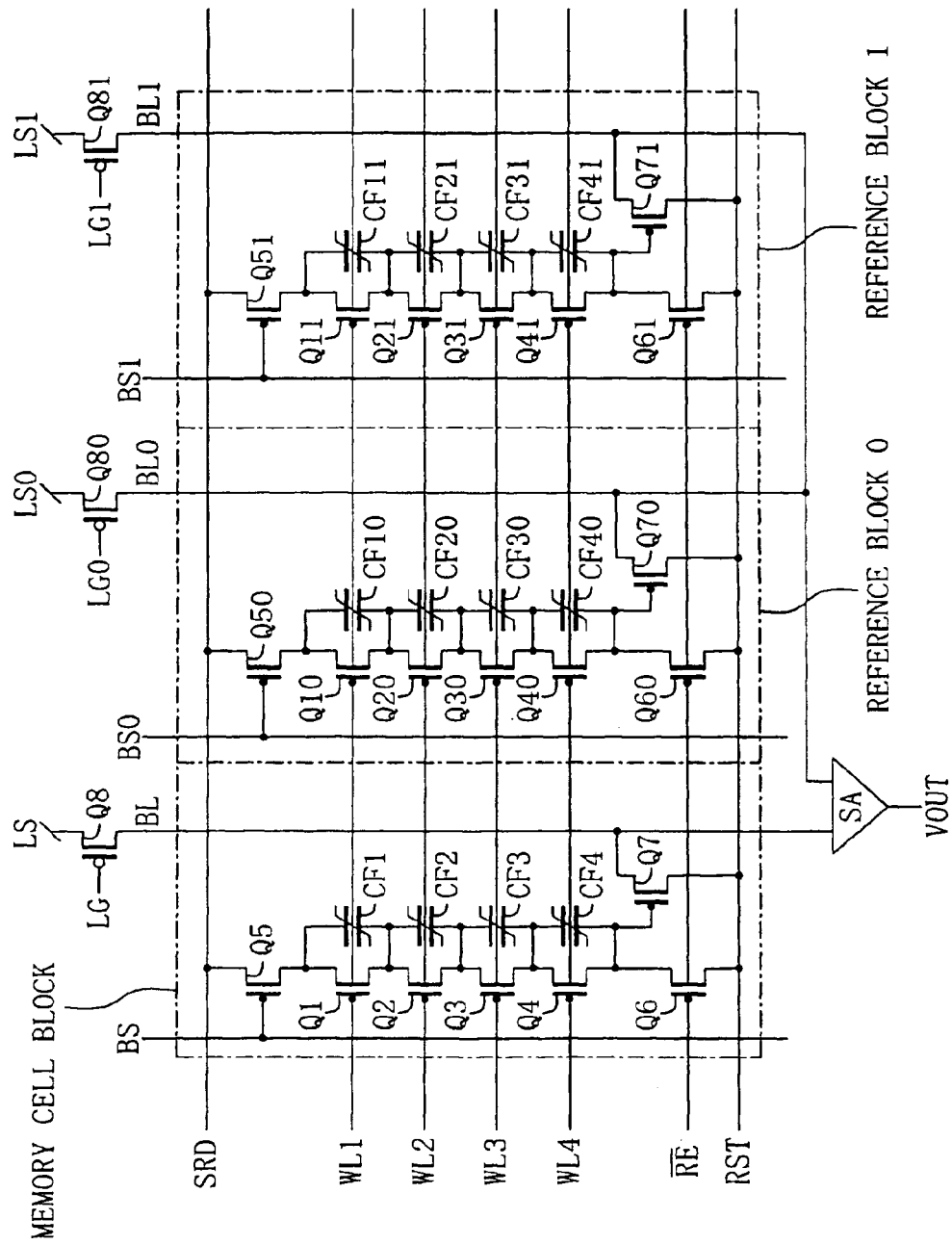
FIG. 5 is an equivalent circuit diagram of a circuit for generating a reference potential in the semiconductor memory of Embodiment 2.
Figure 6:
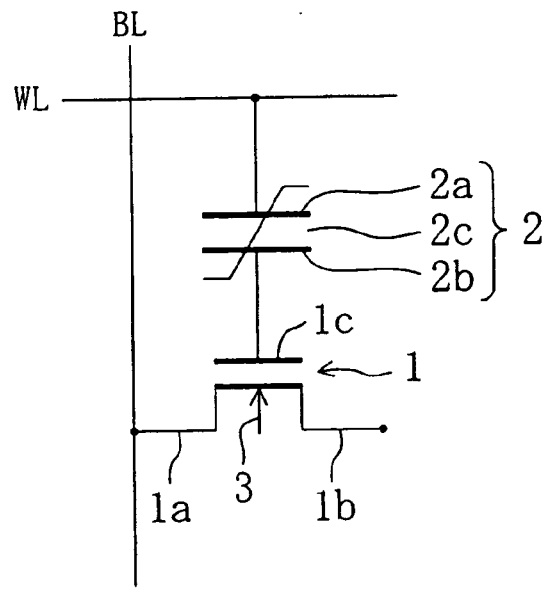
FIG. 6 is a circuit diagram of a conventional semiconductor memory.
Figure 7:
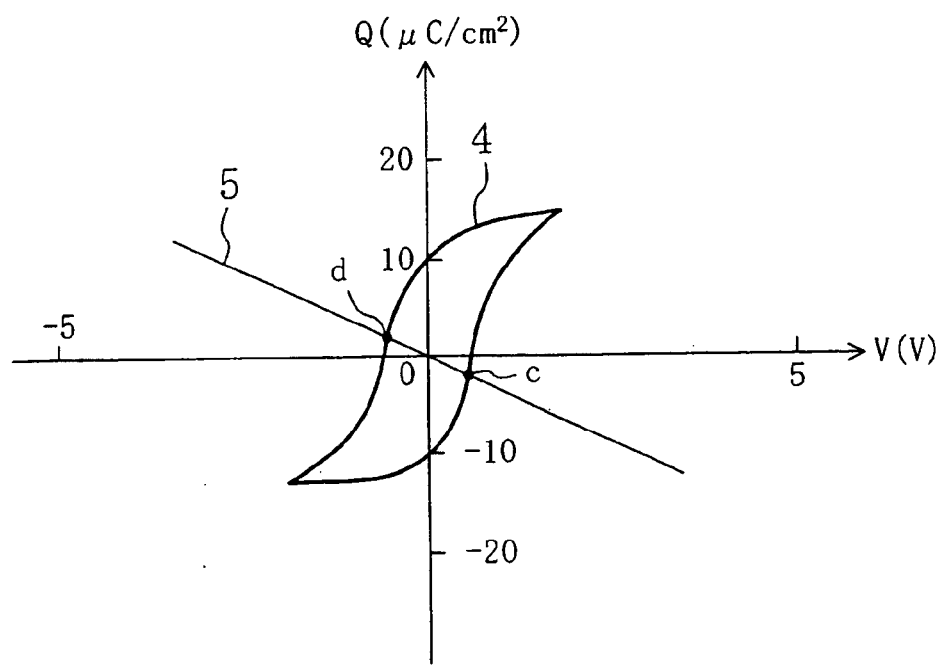
FIG. 7 is a diagram for explaining behavior of a ferroelectric capacitor obtained when a data is written in the conventional semiconductor memory.

FIG. 5 shows the memory cell block of FIG. 2 and a reference voltage generator including a reference block 0 and a reference block 1. Each of the reference blocks 0 and 1 has the same circuit configuration as the memory cell block of FIG. 2.

The set line SRD is connected to the block selecting transistor Q5 of the memory cell block, a block selecting transistor Q50 of the reference block 0 and a block selecting transistor Q51 of the reference block 1. The reset line RST is connected to the read selecting transistor Q6 of the memory cell block, a read selecting transistor Q60 of the reference block 0 and a read selecting transistor Q61 of the reference block 1. The read selecting line /RE is connected to the gates of the read selecting transistor Q6 of the memory cell block, the read selecting transistor Q60 of the reference block 0 and the read selecting transistor Q61 of the reference block 1. One end of the bit line BL of the memory cell block, one end of a bit line BL0 of the reference block 0 and one end of a bit line BL1 of the reference block 1 are connected to a sense amplifier SA.

A data "0" is previously stored in the reference block 0 by the aforementioned method for writing a data "0", and a data "1" is previously stored in the reference block 1 by the aforementioned method for writing a data "1".

In a read operation, the data are read from the reference blocks 0 and 1 by the aforementioned read method. In assuming that a bit line potential generated in reading a data "0" is VBL0 and that a bit line potential generated in reading a data "1" is VBL1, a reference potential corresponding to (VBL0+VBL1) X ½ is generated on the bit line BL0 of the reference block 0 and the bit line BL1 of the reference block 1. This reference potential is compared by the sense amplifier SA with a bit line potential generated in the memory cell block where the read operation is carried out. When the bit line potential does not exceed the reference potential, it is determined that a data "1" is stored, and when the bit line potential exceeds the reference potential, it is determined that a data "0" is stored.

In this case, the reference potential is set to an intermediate potential between the bit line potential VBL0 obtained when a data "0" is stored and the bit line potential VBL1 obtained when a data "1" is stored, so that the operation range can be widen.

The bit line potential VBL0 and the bit line potential VBL1 are preferably generated respectively from a ferroelectric capacitor of the reference block 0 and a ferroelectric capacitor of the reference block 1 disposed on the same row as a ferroelectric capacitor of the memory cell block from which a data is read, and thus, the influence of parasitic capacitance and the like can be equalized. Specifically, for example, in reading a data stored in the third ferroelectric capacitor CF3 of the memory cell block, the bit line potentials VBL0 and VBL1 are preferably generated respectively from data stored in a third ferroelectric capacitor CF30 of the reference block 0 and a third ferroelectric capacitor CF31 of the reference block 1.

Also, the number of memory cell blocks included in each of the reference blocks 0 and 1 is preferably the same as the number of memory cell blocks of the memory cell array. Specifically, although merely one memory cell block is connected to each of the bit line BL, the bit line BL0 and the bit line BL1 in the circuit configuration of FIG. 5, in the case where, for example, ten memory cell blocks are connected to the bit line BL, ten memory cell blocks are preferably connected to each of the bit lines BL0 and BL1. Thus, a stable operation can be realized.

What is claimed is:

1. A method for driving a semiconductor memory, said semiconductor memory containing:
   a memory cell block including a plurality of ferroelectric capacitors successively connected to one another each for storing a data in accordance with displacement of polarization of a ferroelectric film thereof and a reading transistor whose gate is connected to one end of said plurality of successively connected ferroelectric capacitors for reading a data by detecting the displacement of the polarization of said ferroelectric film of a selected ferroelectric capacitor selected from said plurality of ferroelectric capacitors;
   a set line connected to the other end of said plurality of successively connected ferroelectric capacitors;
   a bit line connected to a drain of said reading transistor at one end thereof;
   a reset line connected to a source of said reading transistor at one end thereof; and
   a plurality of word lines respectively corresponding to said plurality of ferroelectric capacitors and provided perpendicularly to said bit line for selecting said selected ferroelectric capacitor,
   wherein voltages applied to said set line and said reset line for writing or erasing a data in said selected ferroelectric capacitor are a power voltage or a ground voltage.

2. A method for driving a semiconductor memory, said semiconductor memory containing:
   a memory cell block including a plurality of ferroelectric capacitors successively connected to one another each for storing a data in accordance with displacement of polarization of a ferroelectric film thereof and a reading transistor whose gate is connected to one end of said plurality of successively connected ferroelectric capacitors for reading a data by detecting the displacement of the polarization of said ferroelectric film of a selected ferroelectric capacitor selected from said plurality of ferroelectric capacitors;
   a set line connected to the other end of said plurality of successively connected ferroelectric capacitors;
   a bit line connected to a drain of said reading transistor at one end thereof;
   a reset line connected to a source of said reading transistor at one end thereof; and
   a plurality of word lines respectively corresponding to said plurality of ferroelectric capacitors and provided perpendicularly to said bit line for selecting said selected ferroelectric capacitor,
   wherein a step of writing a data in said selected ferroelectric capacitor includes sub-steps of:
   causing a potential difference obtained by subtracting a ground voltage applied to said reset line from a power voltage applied to said set line between an upper electrode and a lower electrode of said selected ferroelectric capacitor, whereby turning the polarization of said ferroelectric film of said selected ferroelectric capacitor to a direction of potential gradient of said potential difference; and
   after causing said potential difference, removing said potential difference caused between the upper electrode and the lower electrode of said selected ferroelectric capacitor by applying the ground voltage to said set line.

3. A method for driving a semiconductor memory, said semiconductor memory containing:
   a memory cell block including a plurality of ferroelectric capacitors successively connected to one another each for storing a data in accordance with displacement of polarization of a ferroelectric film thereof and a reading transistor whose gate is connected to one end of said plurality of successively connected ferroelectric capacitors for reading a data by detecting the displacement of the polarization of said ferroelectric film of a selected ferroelectric capacitor selected from said plurality of ferroelectric capacitors;

a set line connected to the other end of said plurality of successively connected ferroelectric capacitors;

a bit line connected to a drain of said reading transistor at one end thereof;

a reset line connected to a source of said reading transistor at one end thereof; and a plurality of word lines respectively corresponding to said plurality of ferroelectric capacitors and provided perpendicularly to said bit line for selecting said selected ferroelectric capacitor, wherein a step of erasing a data written in said selected ferroelectric capacitor includes sub-steps of:

causing a potential difference obtained by subtracting a power voltage from a ground voltage between an upper electrode and a lower electrode of said selected ferroelectric capacitor by applying the ground voltage to said set line and applying the power voltage to said reset line, whereby turning the polarization of said ferroelectric film of said selected ferroelectric capacitor to a direction of potential gradient of said potential difference; and after causing said potential difference, removing said potential difference caused between the upper electrode and the lower electrode of said selected ferroelectric capacitor by applying the ground voltage to said set line.

4. A method for driving a semiconductor memory, said semiconductor memory containing:

a memory cell block including a plurality of ferroelectric capacitors successively connected to one another each for storing a data in accordance with displacement of polarization of a ferroelectric film thereof and a reading transistor whose gate is connected to one end of said plurality of successively connected ferroelectric capacitors for reading a data by detecting the displacement of the polarization of said ferroelectric film of a selected ferroelectric capacitor selected from said plurality of ferroelectric capacitors;

a set line connected to the other end of said plurality of successively connected ferroelectric capacitors;

a bit line connected to a drain of said reading transistor at one end thereof;

a reset line connected to a source of said reading transistor at one end thereof; and a plurality of word lines respectively corresponding to said plurality of ferroelectric capacitors and provided perpendicularly to said bit line for selecting said selected ferroelectric capacitor, wherein a step of reading a data from said selected ferroelectric capacitor includes sub-step of:

applying a power voltage to said bit line and a ground voltage to said reset line, or applying the ground voltage to said bit line and the power voltage to said reset line, and detecting voltage change caused on said bit line by applying a reading voltage to said set line, after detecting said voltage change, removing a potential difference caused between an upper electrode and a lower electrode of said selected ferroelectric capacitor by applying the ground voltage to said set line, and said reading voltage is set to such magnitude that said potential difference does not exceed a conceive voltage of said selected ferroelectric capacitor.

5. The method for driving a semiconductor memory of claim 4, further comprising, after the sub-step if removing said potential difference, a sub-step of turning off said reading transistor.

6. A method for driving a semiconductor memory, said semiconductor memory containing:

a memory cell block including a plurality of ferroelectric capacitors successively connected to one another each for storing a data in accordance with displacement of polarization of a ferroelectric film thereof and a reading transistor whose gate is connected to one end of said plurality of successively connected ferroelectric capacitors for reading a data by detecting the displacement of the polarization of said ferroelectric film of a selected ferroelectric capacitor selected from said plurality of ferroelectric capacitors;

a set line connected to the other end of said plurality of successively connected ferroelectric capacitors;

a bit line connected to a drain of said reading transistor at one end thereof and to one of a load resistance at the other and thereof;

a reset line connected to a source of said reading transistor at one end thereof; and a plurality of word lines respectively corresponding to said plurality of ferroelectric capacitors and provided perpendicularly to said bit line for selecting said selected ferroelectric capacitor, wherein a step of reading a data from said selected ferroelectric capacitor includes sub-step of:

applying a power voltage to the other end of said load resistance and a ground voltage to said reset line, or applying the ground voltage to the other end of said load resistance and the power voltage to said reset line, and comparing with a reference voltage, voltage change caused at both end of said load resistance owing to a current flowing between the drain and the source of said reading transistor by applying a reading voltage to said set line; and after comparing said voltage change, removing a potential difference caused between an upper electrode and a lower electrode of said selected ferroelectric capacitor by applying the ground voltage to said set line.

7. The method for driving a semiconductor memory of claim 6, further comprising, after the sub-step of removing said potential difference, a sub-step of turning off said reading transistor.

8. The method for driving a semiconductor memory of claim 6, wherein said semiconductor memory further includes:

a second memory cell block having the same configuration as said memory cell block and disposed on a side of said memory cell block along a word line direction; and a second bit line connected, at one end thereof, to a drain of a second reading transistor included in said second memory cell block and connected, at the other end thereof, to one end of a second load resistance, said set line is connected to the other end of a plurality of ferroelectric capacitors included in said second memory cell block, said reset line is connected to a source of said second reading transistor included in said second memory cell block, and said reference voltage corresponds to voltage change caused at both ends of said second load resistance owing to a current flowing between the drain and the source of said second reading transistor in applying the power voltage to the other end of said second load resistance and the ground voltage to said reset line, or applying the ground voltage to the other end of said second load resistance and the power voltage to said reset line, and applying the reading voltage to said set line.

* * * * *

UNITED STATES PATENT AND TRADEMARK OFFICE
CERTIFICATE OF CORRECTION

| | | |
|---|---|---|
| PATENT NO. | : 6,967,859 B2 | Page 1 of 2 |
| APPLICATION NO. | : 10/626722 | |
| DATED | : November 22, 2005 | |
| INVENTOR(S) | : Yasuhiro Shimada et al. | |

It is certified that error appears in the above-identified patent and that said Letters Patent is hereby corrected as shown below:

On title page Item (12) and

ITEM (75) Inventors:

The inventor's should be listed as -(1) Yasuhiro SHIMADA and (2) Yoshihisa KATO--;

What is claimed is:

claim 3, column 23, line 29, "to said set" should read --to said reset--;

claim 4, column 23, line 60, "to said set line," should read --to said set line;--;

claim 4, column 23, line 64, "to said set line, and" should read --to said set line; and--;

claim 4, column 23, line 66, "exceed a conceive" should read --exceed a coercive--;

claim 5, column 24, line 2, "sub-step if removing" should read
--sub-step of removing--;

claim 6, column 24, line 21, "to one of a" should read --to one end of a--;

claim 6, column 24, line 22, "other and thereof" should read --other end thereof--;

claim 6, column 24, line 37, "and comparing with a reference voltage" should read
--and comparing, with a reference voltage--; and

UNITED STATES PATENT AND TRADEMARK OFFICE
CERTIFICATE OF CORRECTION

PATENT NO. : 6,967,859 B2
APPLICATION NO. : 10/626722
DATED : November 22, 2005
INVENTOR(S) : Yasuhiro Shimada et al.

It is certified that error appears in the above-identified patent and that said Letters Patent is hereby corrected as shown below:

claim 6, column 24, line 38, "at both end" should read --at both ends--.

Signed and Sealed this

Eighth Day of August, 2006

JON W. DUDAS
*Director of the United States Patent and Trademark Office*